US006535382B2

United States Patent
Bishop et al.

(10) Patent No.: US 6,535,382 B2
(45) Date of Patent: Mar. 18, 2003

(54) COOLING SYSTEM FOR ELECTRONIC EQUIPMENT CABINETS

(75) Inventors: Jerry Bishop, Elkhorn, WI (US); Clay Nesler, Brookfield, WI (US)

(73) Assignee: Johnson Controls Technology Company, Plymouth, MI (US)

( * ) Notice: Subject to any disclaimer, the term of this patent is extended or adjusted under 35 U.S.C. 154(b) by 24 days.

(21) Appl. No.: 09/833,722

(22) Filed: Apr. 12, 2001

(65) Prior Publication Data

US 2002/0149911 A1 Oct. 17, 2002

(51) Int. Cl.[7] .................................................. H05K 7/20
(52) U.S. Cl. ........................ 361/690; 361/692; 361/695; 312/223.1; 454/184
(58) Field of Search .................................. 361/678, 683, 361/685, 687–695, 698, 736–737, 696, 787; 312/223.1, 236, 223.2, 265.3; 29/832; 62/414; 165/80.6, 104.33, 122, 124, 126, 47, 137, 104.34; 174/16.1, 16.3, 16 R; 454/184

(56) References Cited

U.S. PATENT DOCUMENTS

| | | | | |
|---|---|---|---|---|
| 3,626,251 A | * | 12/1971 | Vigue | 174/16 R |
| 3,749,981 A | * | 7/1973 | Koltuniak et al. | 62/414 |
| 4,158,875 A | * | 6/1979 | Tajima et al. | 361/384 |
| 4,449,764 A | | 5/1984 | Hastings | |
| 4,489,363 A | * | 12/1984 | Goldberg | 361/383 |
| 5,126,579 A | | 6/1992 | Breitmeier | |
| 5,414,591 A | * | 5/1995 | Kimura et al. | 361/695 |
| 5,544,012 A | * | 8/1996 | Koike | 361/695 |
| 5,825,620 A | | 10/1998 | Chrysler et al. | |
| 6,151,210 A | * | 11/2000 | Cercioglu et al. | 361/690 |
| 6,186,890 B1 | * | 2/2001 | French et al. | 454/184 |
| 6,237,854 B1 | * | 5/2001 | Avni | 236/51 |

FOREIGN PATENT DOCUMENTS

EP      1017263 A2 * 5/2000 ............ H05K/7/20

* cited by examiner

Primary Examiner—Darren Schuberg
Assistant Examiner—Michael Datskovskiy
(74) Attorney, Agent, or Firm—Foley & Lardner

(57) ABSTRACT

An apparatus for providing cool air to electronic module cabinets wherein a plurality of electronic modules are stacked within a cabinet such that front surfaces of the modules face a front cabinet opening, the apparatus including a plenum door assembly having an inlet for receiving cooling air and a plurality of outlets, the outlets positioned proximate the front faces of the electronic modules so as to provide cool air thereto, the modules in some embodiments having fans that draw air to back sides of the modules opposite the front surfaces, the plenum openings being adjustable to modify the amount of cooling air being delivered to the modules.

20 Claims, 9 Drawing Sheets

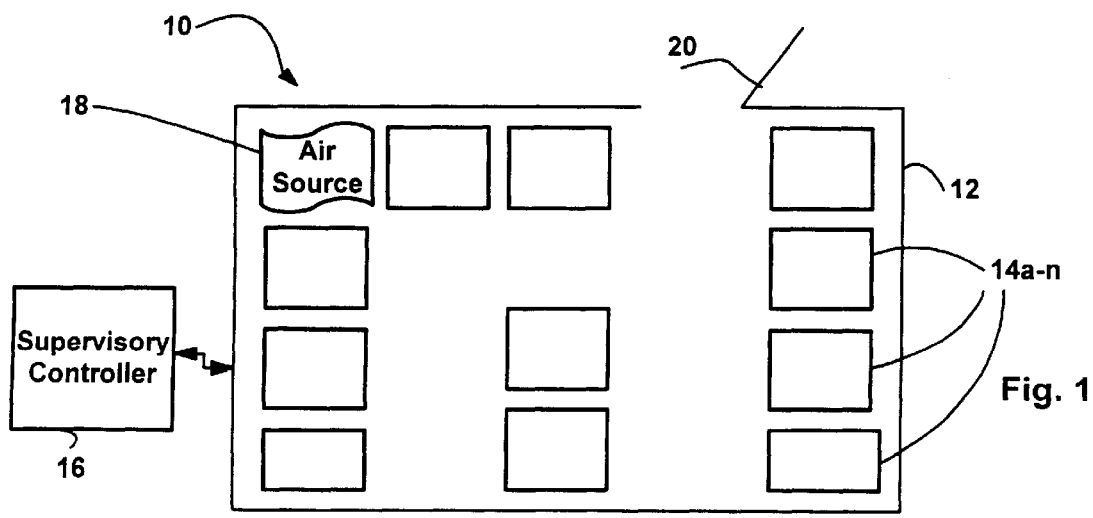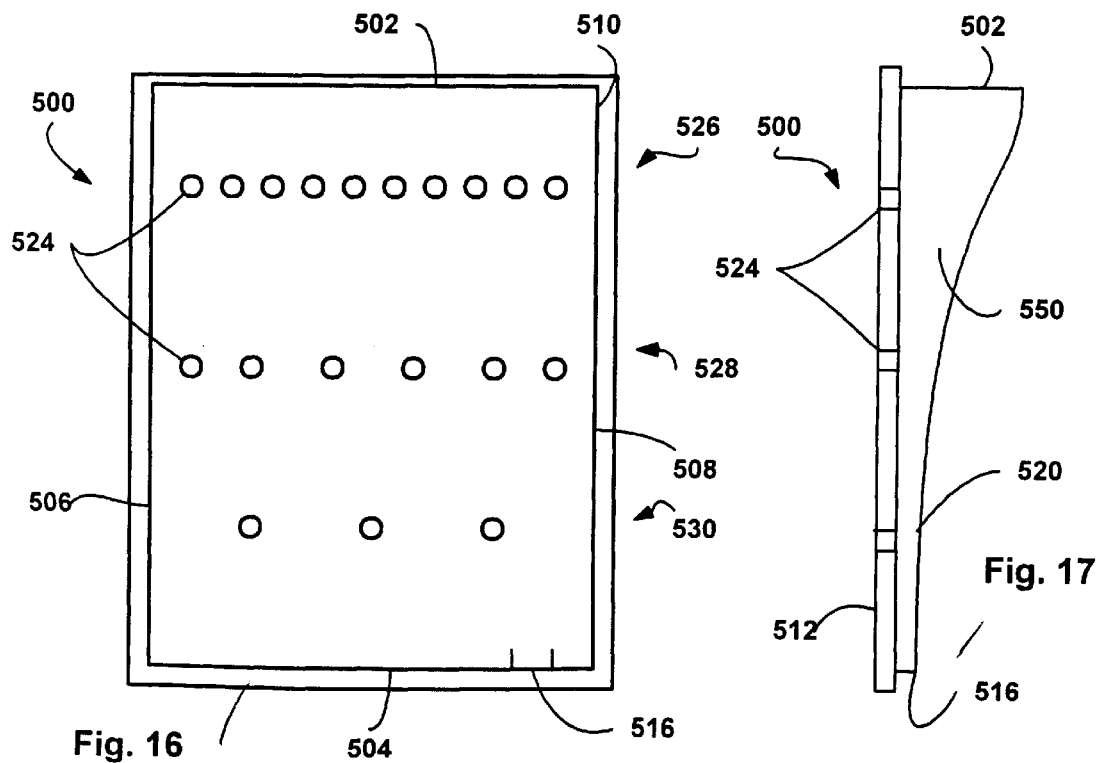

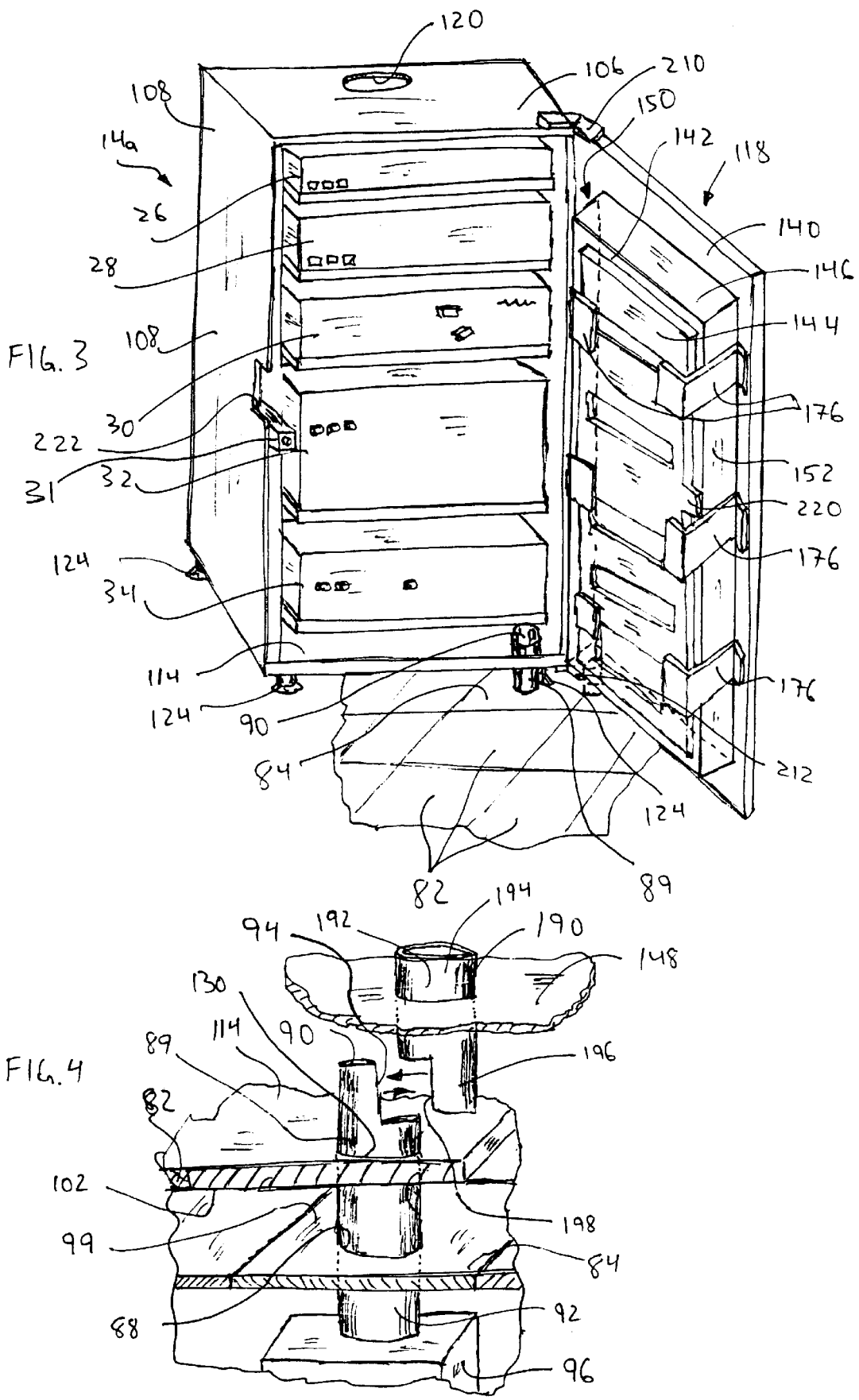

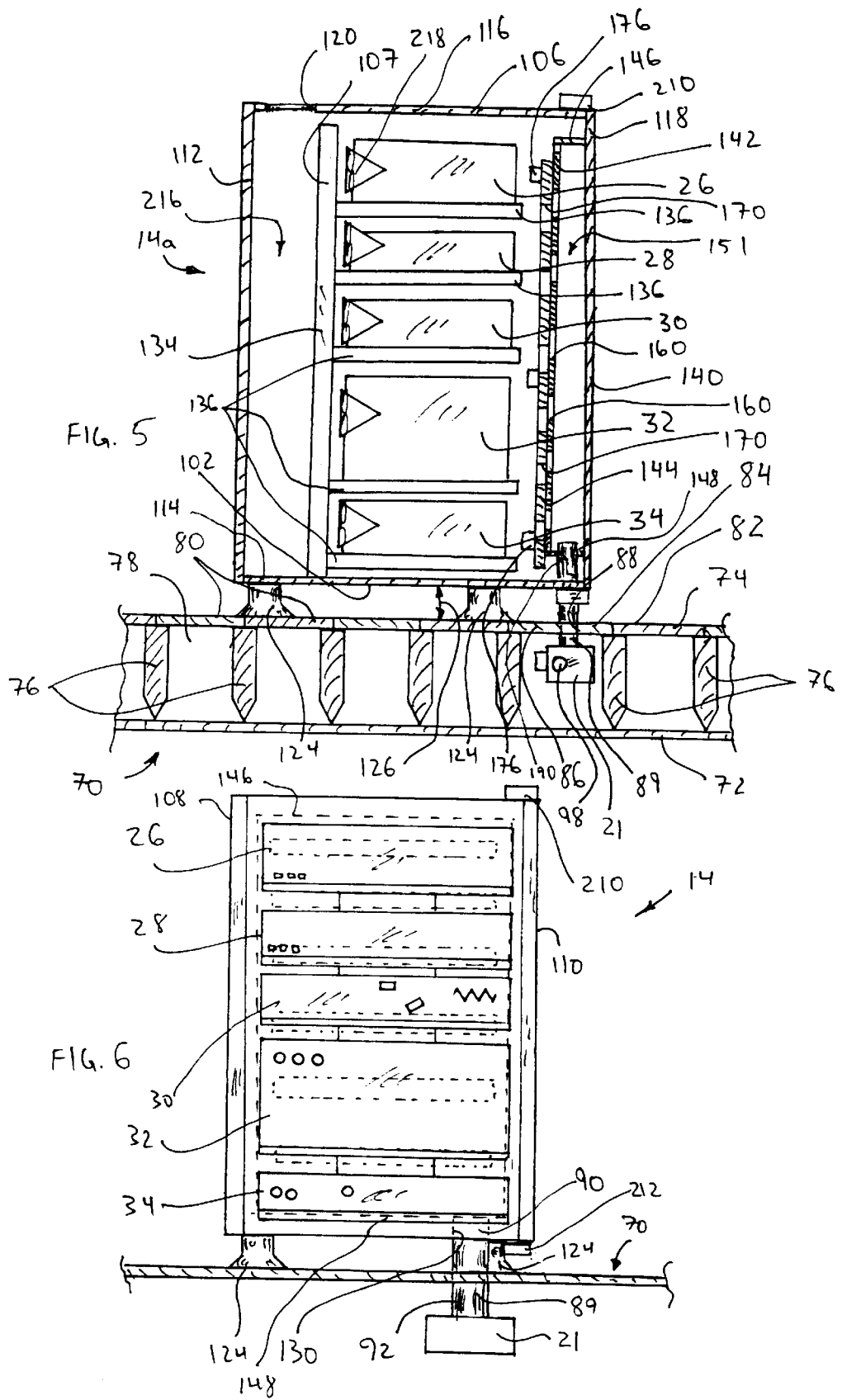

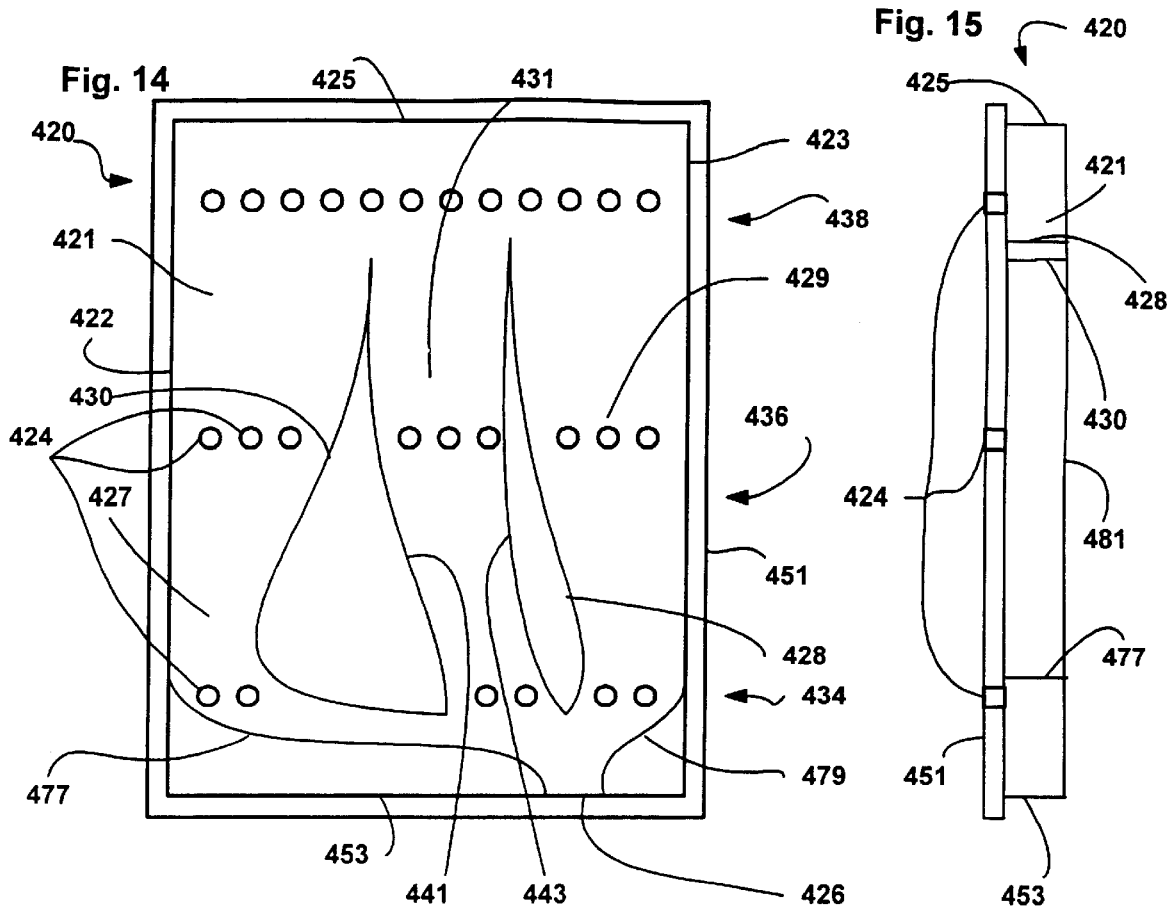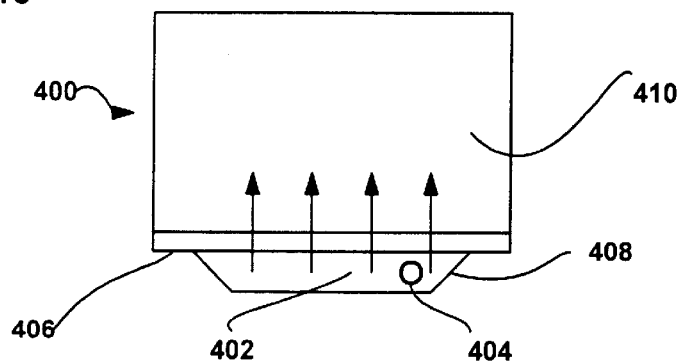

COOLING SYSTEM FOR ELECTRONIC EQUIPMENT CABINETS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention is directed to air cooling systems for electronic equipment and more specifically to a plenum based system for delivering cooing air to an electronic equipment cabinet.

Over the past several decades the advantages of using computers to perform many different tasks has become clear in almost every industry. Even industries once reluctant to embrace new computing tools have been forced to adopt new business strategies that center on computing abilities. Because of this realization many companies and other entities require massive computing and data storage capabilities to support their employees, efficiently manufacture and sell products and provide services to their customers. In fact, not only do computers help businesses to be efficient, but now, most companies could not function without their computing and database capabilities. In effect, computing and database capabilities have become critical to the operations of many companies and other entities such that any disturbance in those capabilities could result in massive loss of business.

To provide the massive amount of computing and database capabilities needed, many companies locate racks of computer servers and other electronic modules in special "critical environment" computing and warehousing rooms where information technology personnel can monitor and maintain the server configurations. Hereinafter servers and electronic modules of all types will collectively be referred to as electronic modules in order to simplify this explanation. Each rack typically includes a plurality of vertically arranged (i.e., one support above another) shelving members. Each member is configured to support one or more electronic modules. The shelving members are often vertically adjustable so that the space between members can be modified to accommodate differently sized electronic modules.

Because technology is advancing quickly, maintaining servers and databases has become extremely expensive. The expense of maintaining and expanding to meet demanding computing capabilities is exacerbated as IT personnel required to maintain and upgrade such capabilities are typically highly skilled. For this reason an entire server/database "hosting" industry (e.g., web hosting) has evolved where industry members maintain massive numbers of servers and other electronic modules and effectively rent out the right to use the modules to customers (i.e., businesses). A similar industry, referred to as "co-location," has also evolved where companies provide conditioned space for their customer's servers, data bases and the like. In both of these industries highly skilled IT personnel can use their expertise to provide services to a huge number of customers thereby spreading costs. In addition, as a customer's computing needs change, the host can accommodate the needs quickly by adding required modules and subletting additional space in the critical environment.

A cabinet is typically constructed about each rack including top and bottom walls, opposing lateral walls and front and back walls. The front and back walls are often hinged and openable to facilitate access to the modules inside the cabinet. In addition, the front wall is often transparent so that IT personnel can observe the devices inside the cabinet and determine status from various visual displays that may be provided.

Often the electronic modules placed within a rack will be replaced by other electronic modules to modify capabilities or change other important system operating parameters. For example; with the fast pace of hardware innovation servers are often obsolete after just a couple of years and therefore server swapping is common.

One problem with virtually all electronic modules, including computers and computer servers, is that, during operation, electronic modules generate heat. If module generated heat is not dissipated quickly enough, the heat can cause the module to malfunction or, when extreme, can destroy the modules.

The industry has developed several different ways in which to cool electronic modules. For example, in the case of stand alone servers, most servers include one or more fans positioned in a back wall of a server housing. The fans run whenever the server is operating to draw air from the space in front of the server over the heat generating devices inside a module housing.

In the case of critical environments, module fans alone cannot be relied upon to maintain low temperatures. Specifically, fans alone cannot be relied upon because, in a typical critical environment, there are so many heat generating modules pumping heat into the ambient that the ambient temperature in the critical environment would reach dangerous levels relatively quickly. In effect, the ambient air would not be cool enough to effectively cool the modules. Thus, in the case of critical environments, many cooling schemes call for monitoring and cooling the entire critical environment.

One common way to cool critical environments has been to raise the floor in the environment so that a space exists below the surface that supports the module cabinets. Then cooling air is pumped through floor tiles into the critical environment. Environment temperature is then monitored at various locations and the cooling air temperature and/or volume is adjusted to maintain the environment at the desired temperature. Ideally the environment temperature throughout the critical environment should be maintained at the same temperature so that if modules are swapped into or out of a cabinet the modules will always be exposed to the same optimal ambient temperature.

While identical and constant temperatures throughout the critical environment are ideal, unfortunately there are several sources of temperature irregularly in typical critical environments. For instance, in addition to providing cooling air through the raised floor, many critical environments route power and information busses there to conceal the busses and maintain unobstructed paths within the environment. One problem with placing the busses and other cables below the raised floor is that the cables and buses can block air flow to parts of the critical environment above the raised floor thus causing the ambient temperature in some parts of the critical environment to be different than in others. Cabinets (and electronic modules therein) in the warmer room areas tend to be warmer than cabinets in the cooler areas.

One other source of temperature irregularity within the critical environment is the disparate amount of heat generated by the different modules and their uses within the separate cabinets. For instance, assuming identical servers, a first cabinet including three servers that operate near full computing capacity generates more heat than a second cabinet including one server that operates at a small fraction of the server's capacity. In this case, all other things being equal, the air temperature near the first cabinet (and inside the first cabinet for that matter) would be warmer than the air temperature near the second cabinet.

Thus, despite efforts to maintain the same conditions throughout a critical environment, often the temperatures within different areas of the critical environment will vary and this variance can result in module failure or pre-mature degradation in performance.

One solution to the critical environment temperature disparity problem is to increase the temperature of the cooling air forced into the critical environment so that even the warmest area within the room is cool enough to minimize or avoid module failure. Unfortunately, IT personnel are routinely inside the critical environment during system operations to monitor and work on modules and therefore this solution is often unworkable.

Another solution to the critical environment temperature disparity problem has been to identify temperatures throughout a critical environment at relatively small spatial intervals and then adjust air flow through baffled raised floor tiles within the environment to even out environment temperature. A manual procedure to accomplish this task has required an environment administrator using an air temperature sensor to place the sensor at many equispaced locations within a critical environment and at a specific height (e.g., 2 feet) above the floor surface and take a plurality of temperature readings. The readings are then fed into a computer that generates a three dimensional map of temperature in the environment as a function of location within the environment. Where "hot spots" occur the administrator then adjusts tile baffles. Thereafter the administrator again collects temperature readings throughout the environment and causes the computer to generate the map to see the results. In the alternative, instead of adjusting baffle settings, the administrator may actually have cables/buses under the raised floor rerouted where air paths are essentially blocked so that static pressure under the raised floor is more even. Clearly, this solution is extremely labor intensive and thus costly. In addition, ideally, this solution should be repeated each time the cable/bus configuration or the modules in the critical environment are modified as any change in environment configuration can alter air flow and hence temperature patterns.

Yet one other solution to the critical environment temperature disparity problem is to, in addition to cooling the ambient, provide cabinet monitoring equipment including temperature sensors inside cabinet housings that are linked to a processor. The processor can then monitor temperature in the cabinets and generate an alarm when the temperature inside any given cabinet exceeds some threshold level. In this way IT personnel are alerted when the temperature within a cabinet is dangerously high and can take steps to remedy the problem.

While the above solutions are advantageous they have some shortcomings. First, there is some loss of cooling capability prior to cooling the devices simply because cool air from the floor is released into the large critical environment.

Second, module cooling is relatively inefficient. Clearly colder cooling air facilitates more efficient cooling. In the case of ambient cooling, the air drawn over the electronic modules includes the cooling air from within the raised floor mixed with the warm exhaust air form the cabinets within the critical environment. Thus, while the air supplied to the critical environment is cold, the cooling air is relatively warm and hence the cooling function is inefficient.

Third, ambient cooling systems cannot be adjusted to increase or decrease the amount of cooling air provided to each cabinet as a function of immediate requirement. For example, at a first time all modules within a cabinet may be operating near full capacity while at a second time the modules may be operating at a small fraction of total capacity. When at full capacity, generated heat will be much greater than when at the fraction of total capacity and hence the optimal amount of cooling air to be delivered will change over time. Ambient cooling systems cannot accommodate such optimal requirements.

One attempt to address the problems with ambient cooling systems is described in U.S. Pat. No. 5,216,579 (the '579 patent) entitled "Rack Based Packaging System for Computers with Cable, Cooling and Power Management Module" that issued on Jun. 1, 1993. The '579 patent teaches a system including a power plenum, a cooling plenum and a cable plenum. The plenums are arranged adjacent each other to form a plenum construct and the construct is attached to a side or lateral wall of an electronic module cabinet such that each plenum extends along the entire vertical length of the cabinet. The plenums are positioned in logical locations with respect to each other and with respect to the configuration of the modules within the cabinet. For example, in one embodiment the power plenum is provided adjacent the back side of the cabinet and includes power outlets, the cable plenum is positioned adjacent a front side of the cabinet and provides space for data buses and the like while the cooling plenum is positioned between the other two plenums. This configuration makes sense as the electronic modules typically link to power from a rear module face while the data buses are often linked to connectors positioned on the front surfaces of the modules.

In another configuration the '579 patent teaches that the cooling plenum may be positioned on the side of the cabinet adjacent the front cabinet wall. The '579 patent teaches that this configuration is advantageous as the cooling air is delivered closer to the front of the servers as opposed to a side.

The cooling plenum channels cooling air directly from a raised floor up along the side of the cabinet. The cabinet includes a plurality of openings that are aligned with openings in the cooling plenum. Air pumped into the cooling plenum therefore is delivered to different parts of the cabinet to cool modules therein. Exhaust air is then directed into the ambient by fans in the back walls of server housings.

The '579 solution delivers cooling air directly to the electronic module cabinets and therefore is much more efficient than the ambient cooling concepts described above. Nevertheless, the '579 patent also has several shortcomings. First, to provide the best cooling pattern an air plenum should provide air along each of the front faces of the modules in the cabinet with the fans drawing the air through the servers and out to the exhaust ports. The '579 solution provides cooing air to only one side of the cabinet. This is true even in the case where the cooling plenum is adjacent the front cabinet wall. Thus, despite recognizing that it is important to deliver cooling air to the front of each module, the '579 patent fails to teach an optimal design that performed this function evenly across the front faces of the modules.

Second, the '579 plenum cannot be adjusted to modify air distribution along the length of the plenum. This is in part due to the fact that the '579 plenum has to be designed to provide air at the openings in the cabinet which typically are not adjustable. The ability to adjust air distribution along the length of the plenum is particularly important for efficient cooling as the equipment within a cabinet may be changed often and the relative positions within the cabinets of heat generating components and air flows may be modified periodically. In this regard, in a first cabinet primary heat generating components may be positioned in the cabinet bottom while in a second cabinet the primary heat generating components may be positioned in the top of the cabinet. Here, even distribution of cooling air along the entire cabinet length would not be efficient.

In addition, even where component configurations are not changed, throughout the course of a day certain electronic modules will often generate appreciably different amounts of heat such that the cooling air requirements will fluctuate throughout the day.

Third, the '579 plenum air delivery system is completely static. That is, the delivery system cannot automatically determine when the temperature within a cabinet is at a dangerous level and cannot automatically alter the air delivery function to address the dangerous levels. For instance, assume that cables within the space below a raised floor impede the air path to several plenum inlets in one part of a critical environment. In this case the '579 solution would not recognize that a problem exists and thus the electronic modules inside the cabinet would not receive sufficient cooling air. In systems including cabinet temperature sensors the sensors would indicate the temperature problem and IT personnel could then address the matter. However, this solution is relatively inefficient and, in some cases, can lead to system shut down if IT personnel do not respond in a timely fashion.

U.S. Pat. No. 6,188,189 (the '189 patent) that issued on Feb. 13, 2001 and that is entitled "Fan Speed Control System" teaches one system that automatically alters cooling air volume as a function of cabinet temperature. To this end, the '189 patent teaches that dedicated temperature sensors can be positioned at various locations within a cabinet. The sensors are monitored and fan speeds are altered as a function of cabinet temperature. Other systems regulate cooling in other fashions (e.g., via damper control or cooling air temperature). While the '189 solution advantageously provides automated control of cooling air volume, this solution to the temperature control problems is relatively expensive requiring a plurality of dedicated temperature sensors.

One other problem with a fan speed controlling system like that taught in the '189 patent is that the space from which the fan attempts to draw air could be blocked so that the fan, in fact, draws little air and the cooling effect is minimal. For example, as in the '579 patent, where the air is drawn from below a raised floor, as indicated above, cables buses below the floor could obstruct air flow such that even the air flow caused by a high speed fan would be minimal.

In the case of co-location companies and web-hosting companies, yet another problem with the above described systems is that the companies have no accurate way of determining how to attribute cooling costs to separate customers. The cooling costs are simply chalked up as overhead and split in some relatively arbitrary fashion among customers. For instance, one way to attribute costs to customers is by square footage of a facility required to house a customer's servers or servers rented by the customer. This solution may require a customer to pay far more than the customer's share of cooling costs. For example, assume a first customer's cabinets require 50% of the total square footage of a critical environment but that the customers modules are essentially fully utilized so that the customer's modules require 80% of the cooling that occurs during a particular month. While it would be equitable to charge the first customer for 80% of the total cooling costs, an arbitrary square foot billing system would undercharge the first customer by 30% of the total cooling costs.

Thus, there is a need for a more efficient cool air delivery system for use in critical environments. In addition, there is a need for an air delivery system that can automatically alter air volume to module cabinets based on cabinet and/or component temperature. Moreover, there is a need for a system that automatically tracks critical environment temperatures throughout a data center environment and provides information regarding the same. Furthermore, there is a need for a system whereby cooling costs can be equitably allocated to various customers.

BRIEF SUMMARY OF THE INVENTION

It has been recognized that a plenum or other form of air delivery member can be constructed on the inside of an electronic module cabinet door that can deliver cool air extremely efficiently to modules inside the cabinet to increase cooling efficiency. In some embodiments the plenum includes the cabinet door while in others the plenum is a retrofit assembly that can be added to an existing door to provide the cooling air. In several embodiments cool air is pumped directly into the plenum via a conduit member that extends from a cooling air source below the cabinet.

In general terms, the present invention includes an apparatus for use with a frame defining a front, a back and first and second sides extending from the frame front to the frame back for supporting and mounting at least one electronic module, the module including a front wall and a back wall, the front wall forming at least one inlet and the back wall forming at least one outlet, the apparatus for delivering air to the at least one module and comprising at least one plenum mounted to the first side and defining a passageway adjacent the front side of the frame, the plenum including at least one opening facing the first side and a cooling air source linked to the plenum to provide cooling air to the plenum.

In some applications the plenum includes a door member and at least one wall member spaced from the door member so as to form the passageway, the door member having an edge and being hingedly linked to the frame along the edge for rotation about the edge between a closed position where the plenum is adjacent the first side and an open position where the plenum is extended from the first side. Also, the plenum may further include first and second plenum lateral walls and an end wall, the lateral walls opposing each other and traversing the distance between the door member and the wall member and the end wall traversing the distance between the lateral wall members opposite the air source.

In several embodiments the apparatus further includes a first mating member linked to the air source and a second mating member linked to the plenum and positioned proximate the first mating member when the door member is closed, the first and second mating members configured such that one of the mating members receives the other mating member when the door member is closed and the mating members together form a passage from the air source to the plenum. The air source may be positioned below the door member and the second mating member may extend upward below the door member when the door member is in the closed position. In a preferred embodiment the second mating member extends upward below the hinge.

In some embodiments the apparatus includes a conduit member positioned proximate the hinged edge of the door connecting the air source to the plenum.

In some embodiments the plenum is formed at least in part of a transparent material. The transparent material may be Plexiglass. The plenum may further include a baffle member mounted adjacent the opening for movement with respect thereto, the baffle member movable with respect to the opening such that the baffle member blocks different portions of the opening. The plenum may form a plurality of openings and the baffle member may be moveable with respect to the plurality of openings to block varying portions of the openings.

The invention also includes a cooling assembly for cooling at least one electronic module, the module including a front wall and a back wall, the front wall forming at least one inlet and the back wall forming at least one outlet, the front wall also forming a front surface. In this case the assembly includes a frame defining a front side, a back side and first and second sides that separate frame front and back sides, a rack mounted inside the frame including an upright member and at least one essentially horizontal shelf member, the module positionable on the shelf member such that the front surface faces the front side, at least one air delivery member forming at least one opening, the delivery member mounted to the frame such that the opening faces the front surface and a cooling air source linked to the delivery member to deliver cooling air to the delivery member.

Here the assembly may further include first and second lateral wall members that essentially close the first and second sides of the frame, respectively. The assembly may also include a back wall member that essentially closes the back side of the frame. In some embodiments the frame further defines top and bottom sides and further includes top and bottom wall members that essentially close the top and sides, respectively. The top wall may form at least one outlet proximate the back wall member. When in a closed position, the delivery member may block the front side of the frame.

In some applications the delivery member is hingedly mounted to the frame for movement between the closed position and an open position where the first side is unobstructed. The size of the opening formed by the delivery member may be adjustable.

The invention further includes a cooling assembly comprising an electronic module including a front wall and a back wall, the front wall forming at least one inlet and the back wall forming at least one outlet, the front wall also forming a front surface, the module including at least one operating parameter sensor, linked to a data bus and capable of communicating status of the at least operating parameter via a standard network protocol, at least one air delivery member forming at least one opening, the delivery member mounted adjacent the module such that the opening faces the front surface, a damper linked to the air delivery member and linked to the data bus, a cooling air source linked to the damper and a processor linked to the bus for receiving the status communication and for controlling the damper as a function of the status communication. One standard protocol is SNMP although other standard protocols aae contemplated.

The invention, moreover, includes an apparatus for cooling at least one electronic module inside a module cabinet, the cabinet including a door, the apparatus comprising a cooling air source linked to the cabinet, a sensor for sensing the status of the door and a controller for controlling the amount of air provided to the cabinet via the cooling air source, the controller linked to the sensor and programmed to modify the cooling air volume delivered to the cabinet as a function of the door status. Here, the controller may reduce the air delivered to the cabinet when the door is opened. In fact, in some applications the controller blocks air delivery to the cabinet when the door is opened.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

BRIEF DESCRIPTION OF THE SEVERAL VIEWS OF THE DRAWINGS

FIG. 1 is a schematic view of a critical environment in which the present invention is employed;

FIG. 3 is a perspective view of a cabinet assembly according to the present invention;

FIG. 4 is a perspective partial cross-sectional view of a cool air conduit assembly illustrated in FIG. 3;

FIG. 5 is a partial cross-sectional view of the assembly of FIG. 3, albeit with the plenum door assembly in a closed position;

FIG. 6 is a front plan view of the assembly of FIG. 3, albeit with the door assembly in a closed position;

FIG. 13 is a top plan schematic view of a cabinet including a plenum attached to the exterior of the cabinet door;

FIG. 14 is a front plant view of a plenum design including several air paths through the plenum;

FIG. 15 is a side elevational view of the assembly of FIG. 14;

FIG. 16 is similar to FIG. 14, albeit illustrating another embodiment; and

FIG. 17 is similar to FIG. 15, albeit illustrating the embodiment of FIG. 16.

DETAILED DESCRIPTION OF THE INVENTION

Figure 2:
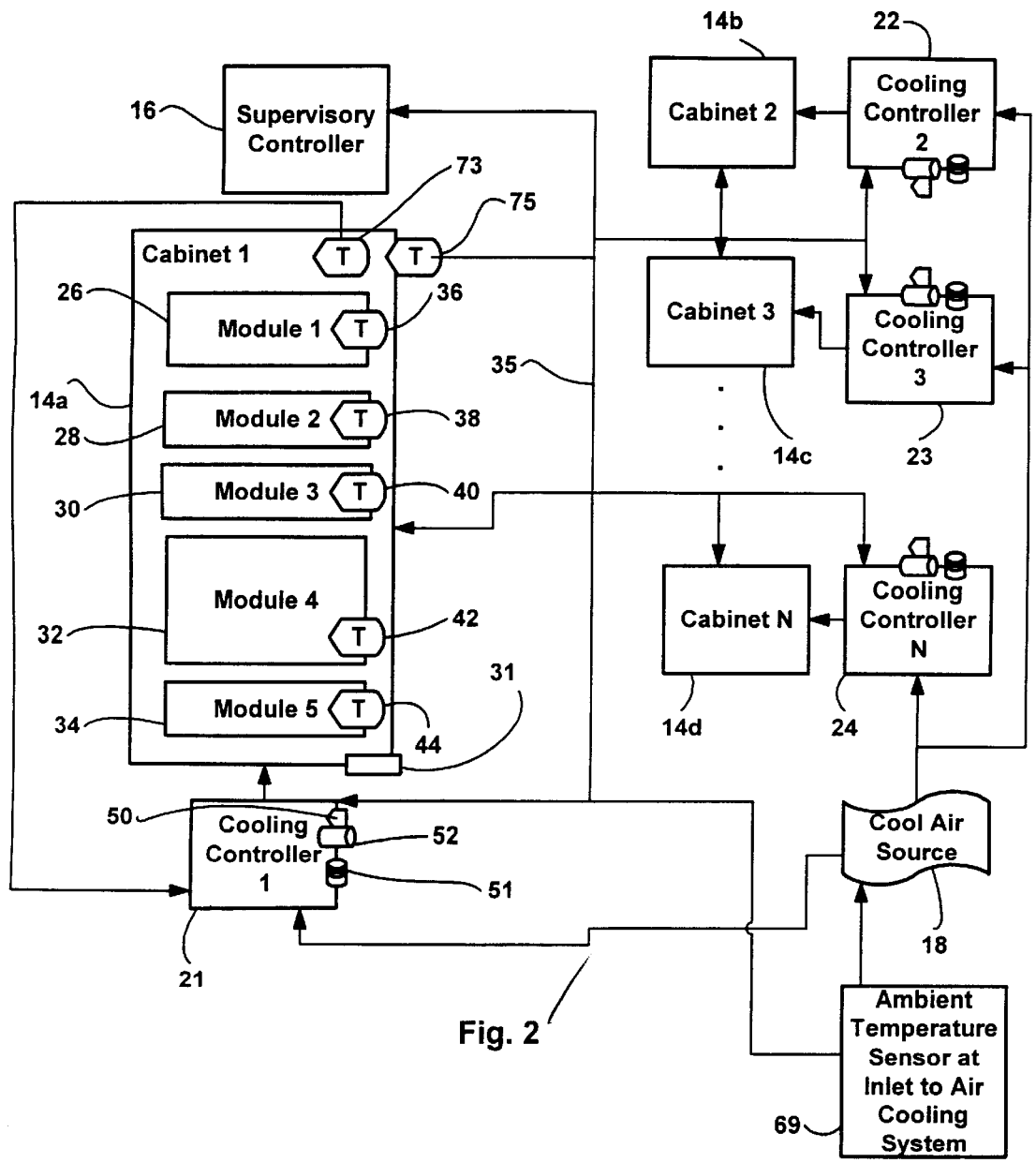
FIG. 2 is a schematic diagram illustrating many of the components of FIG. 1, albeit with additional detail.

Referring now to the figures where like reference numerals correspond to similar elements throughout the several views and, specifically, referring to FIG. 1, the present invention will be described in the context of an exemplary critical environment room 10 (hereinafter a critical environment) including four insulated walls 12 and an insulated door 20 that define an environment space. Within environment 10 a plurality of electronic module cabinet assemblies 14a–n are arranged in a spaced format so that footpaths allow an environment administrator to access each one of the cabinet assemblies 14a–n. An air source 18 is located inside environment 10 and provides cooling air to environment 10 in a manner which will be described in more detail below. In addition, a supervising controller 16 is located outside environment 10 but links to various components within environment 10 via one or more data buses that enable supervising controller 16 to monitor and control environment characteristics.

Referring now to FIGS. 1, 5 and 6, the floor 70 within environment 10 includes a bottom support member or assembly 72 and a top support assembly 74 that are separated by beam members 76 to form a gap or space 78 therebetween. The cooling air source 18 provides cool air within space 78. Support assembly 74 includes a plurality of support tiles collectively referred to by numeral 80, each tile 80 spanning the distance between two adjacent support beams 76 such that together the tiles 80 form a support surface 82 for supporting cabinet assemblies 14 thereabove.

Some of the tiles are special in that they include control mechanisms for controlling movement of cool air from within space 78 to locations thereabove in environment 10. Specifically, according to the present invention, special control tiles (e.g., 84) are provided to facilitate delivery of cool air from space 78 directly into cabinet assemblies (e.g., 14a) thereabove. Referring also to FIGS. 3 and 4, tile 84 includes a tile member 86 similar to the tiles 80 except that member 86 forms a circular opening 88. In addition to member 86, tile 84 also includes a first mating member or conduit member 89 having an upper end 90 and a lower end 92. Upper end 90 forms a semicircular cut-out 94 best seen in FIG. 4. Tube 89 is sized so as to fit snuggly within aperture 88 and, to secure tube 89 within aperture 88, other mechanical components not illustrated may be used.

Referring still to FIGS. 4, 5 and 6 and also to FIG. 2, in addition to member 86 and member 89, control tile 84 also includes a cooling controller unit 21 that is attached to lower end 92 of tube 89. Cooling controller 21 is sized so that it fits between adjacent members 76 below assembly 74 and is positioned such that an opening 98 is unobstructed by any of members 76. The top end 90 of tube 89 extends up above a top surface 99 of tile 84 and into a cabinet 14a as explained in more detail below. Controller 21 includes a damper and a processor (not separately illustrated), the processor programmable to perform any of several different functions to control the damper.

Referring still to FIG. 2, for the purposes of the present invention it is assumed that each of cabinet assemblies 14a through 14n and their corresponding controllers (e.g., controller 21, 22, 23, and 24) are essentially identical and therefore only cabinet 14a and its corresponding controller 21 will be described here in any detail. In one embodiment controller 21 is equipped with an air temperature sensor 52, a static pressure sensor 50 and a flow rate sensor 51. Referring also to FIGS. 4 and 5, the pressure sensor 50 senses the static pressure within space 78 below support assembly 74 (see also FIG. 5) at the location of controller 21. Flow sensor 51 measures the rate of air flow through the damper in controller 21. Supervising controller 16 is linked via a data bus to each of the cooling controllers as illustrated so that supervising controller 16 can retrieve temperature, pressure and flow rate information corresponding to each damper location below the critical environment 10 for various purposes described below, can provide information to each controller and can, in at least some embodiments, control each of the controllers.

Referring to FIGS. 2, 3, 5 and 6, cabinet assembly 14a includes a housing 106, a shelving unit 107, five electronic modules 26, 28, 30, 32 and 34, an internal temperature sensor 73 and an external temperature sensor 75. Housing 106 includes opposing lateral walls 108 and 110, a back wall 112 which traverses the distance between the two lateral walls 108 and 110, a bottom wall 114, a top wall 116 and plenum door assembly 118. Lateral walls 108 and 110, back wall 112, bottom wall 114 and top wall 116 may be formed of various materials such as reinforced sheets of steel, plastic or the like, although not illustrated, vent openings may be provided in any of these walls to allow venting of heat to the ambient.

Top wall 116 forms venting outlet 120 near the back end of assembly 14a opposite door assembly 118. Outlet 120 may be larger than illustrated or may comprise several outlets. In addition, although not illustrated, a fan may be provided within outlet 120 to draw warm air out of housing 106.

A plurality of foot members collectively referred to by numeral 124 extend from the bottom surface 102 of bottom wall 114 to support housing 106 thereabove and define a space 126 between surface 82 and undersurface 102 (see FIG. 5). In addition, bottom wall 114 forms an opening 130 similar to opening 88 in tile 84. Opening 130 is formed proximate the edge of wall 114 that is adjacent door assembly 118 when the door assembly 118 is closed. In fact, opening 130 is below a plenum defined by assembly 118 when assembly 118 is in a closed position.

As illustrated, in some embodiments conduit member 89 extends up and through opening 130 into housing 106 so that cutout section 94 is above bottom wall 114. Member 89 is positioned so that cutout section 94 faces the side of housing 106 that is closable via door assembly 118.

Referring now to FIGS. 3, 5, 6, 7 and 8, door assembly 118 includes a flat stiff planar member 140 which serves dual functions including closing a front side of housing 106 and forming a plenum wall to help direct cool air within housing 106. In addition to member 140, assembly 118 also includes other components that cooperate to form the plenum including another wall member 142, a baffle wall 144, top and bottom plenum walls 146 and 148, respectively, and lateral plenum walls 150 and 152.

Lateral walls 150 and 152 oppose each other and separate wall members 140 and 142. Similarly, top and bottom walls 146 and 148 oppose each other and separate wall members 140 and 142 such that walls 140, 142, 146, 148, 150 and 152 define a plenum space 151 (see best in FIG. 5). In the illustrated embodiment lateral walls 150 and 152 and top and bottom walls 146 and 148 do not form openings although, in some embodiments, those walls may form openings. Wall member 142 forms a plurality of openings some of which are identified by numeral 160. Openings 160 are generally equi-spaced along the vertical length of member 142 and extend across the width of member 142.

Baffle member 144 has a size, shape and construction that is similar to wall member 142. To this end, baffle member 144, when assembled with other plenum components, is vertically arranged and forms a plurality of openings, some of which are identified by numeral 170 that are essentially vertically equi-spaced and extend nearly across the width of member 144. Openings 170 have shapes similar to openings 160.

Figure 7:
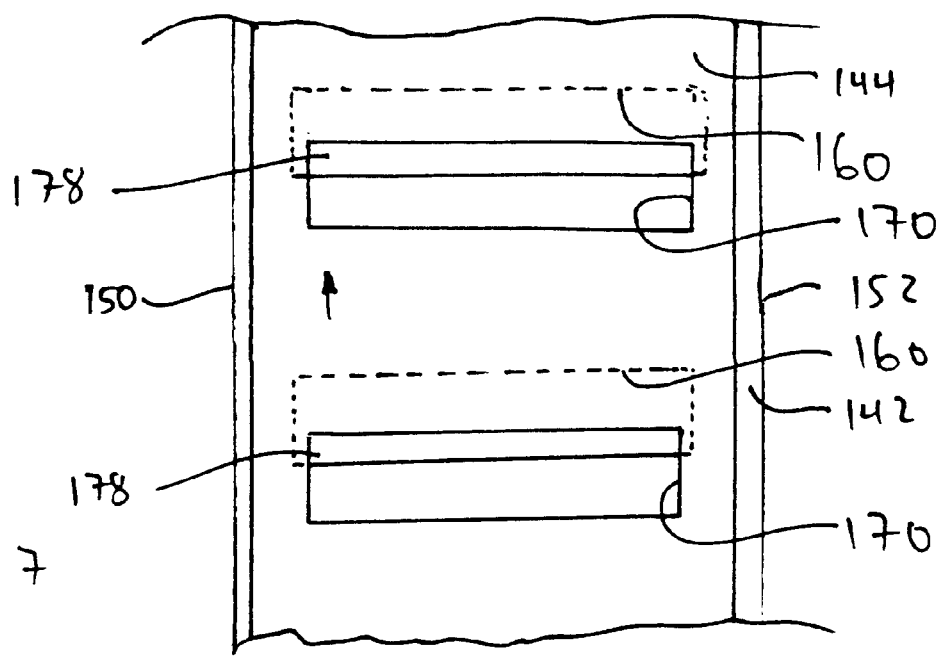
FIG. 7 is schematic view of the baffle assembly of FIG. 3.
Figure 8:
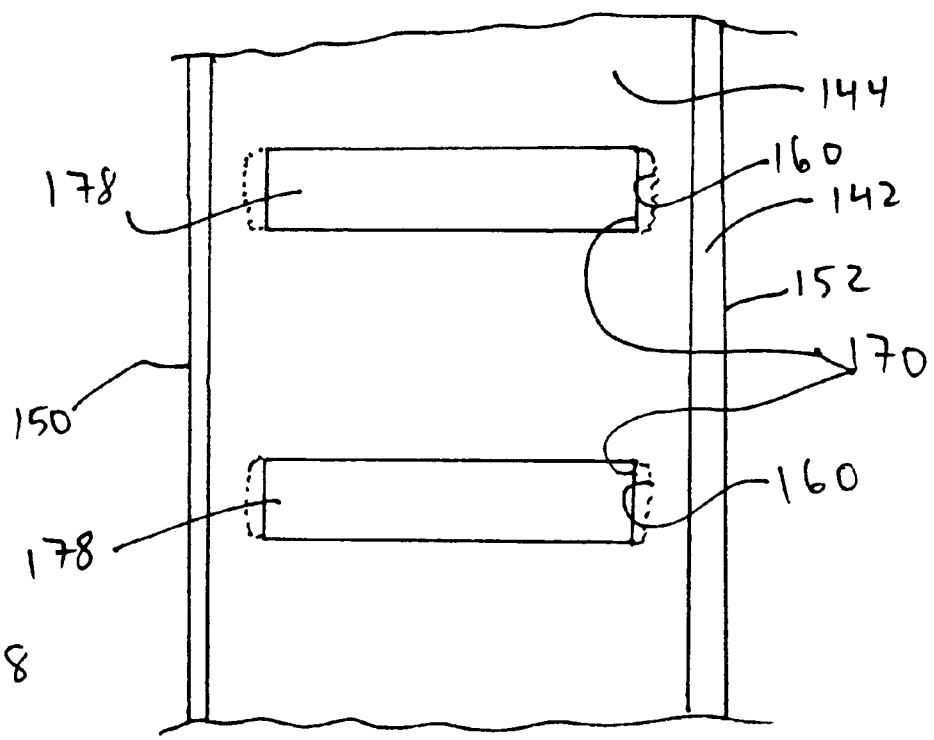
FIG. 8 is similar to FIG. 7, albeit with the baffle assembly in a different relative position with respect to other plenum door assembly components.

In addition to the components described above, door assembly 118 also includes a plurality of brackets best seen in FIGS. 3 and 5 and collectively identified by numeral 176. The brackets cooperate to mount baffle assembly 144 against wall assembly 142 for slidable movement to any of several vertical positions. For example, referring to FIGS. 7 and 8, two different baffle positions relative to member 142 are illustrated. In FIG. 7, baffle 144 is positioned in a relatively low orientation with respect to wall member 142 and therefore openings 170 are misaligned with openings 160 and the effective openings 178 are relatively small. In FIG. 8, baffle 144 is positioned relative to wall member 142 such that openings 170 are aligned with openings 160 and the effective openings 178 are maximized. Brackets 176 should be sized and designed such that they facilitate affirmative vertical baffle movement but such that, after the baffle position is set, the position will be maintained until another affirmative action is taken.

Referring to FIGS. 3 through 6, plenum bottom wall 148 forms an opening 190 sized to receive a tube or conduit having a diameter that is essentially identical to the diameter of conduit member 89. Door assembly 118 further includes a second mating member or conduit member 192 that has a top end 194 and a bottom end 196. Second conduit member 192 is secured within opening 190 and to that end, any type of securing mechanism can be used. Top end 194 extends into the space 151 defined by the plenum walls while bottom end 196 extends below plenum bottom wall member 148. Bottom end 196 has a semi-circular cut-out 198 that is similar to cut-out 94 in first tube 89 and is the mirror image thereof such that when the top end 90 of tube 89 and bottom end 196 of tube 192 are brought together, the ends mate and form a passage way. To form a better seal, the mating edges of tubes 89 and/or 192 can be equipped with an elastomeric seal or other sealing mechanism to facilitate air flow from below tile 84 into plenum space 151.

Referring to FIGS. 3, 5 and 6, door assembly 118 is supported by top and bottom hinges 210 and 212, respectively for pivotal movement between a closed position and any of several different open positions so that a system user can open the plenum door assembly 118 to access the electronic modules therein. Referring also to FIG. 4, in order to minimize movement of second tube 192 and therefore potential misalignment, in at least some embodiments of the invention the aperture 190 is provided proximate the lower hinge 212.

Referring still to FIGS. 3, 5 and 6, shelving assembly 107 includes a vertical upright frame member 134 and a plurality of shelf members collectively referred to by numeral 136. Upright frame member 134 is secured within housing 106 relatively closer to back wall 112 than to door assembly 118 but still forming a space 216 to facilitate air circulation. Shelf members 136 extend from frame member 134 toward door assembly 118. Shelf members 136 are vertically adjustable so as to accommodate electronic modules having different vertical height requirements.

Electronic modules 26, 28, 30, 32 and 34 are positioned on and supported by separate shelf members 136. Each electronic module includes one or more small fans near a back end of the module and each module is arranged on its corresponding shelf so that the fan (e.g., 218) faces frame member 134 and air circulation space 216. Although not illustrated, a plurality of cables and data buses will be provided either within space 216 or laterally with respect to modules 26, 28, 30, 32 and 34 that provide power to the modules and also enable data communication between the modules, other modules in other cabinet assemblies and perhaps modules in other critical and non-critical environments.

Referring yet again to FIGS. 3, 5 and 6, while door assembly 118 can be formed of any rigid material, preferably many of the components that constitute door assembly 118 are formed of a transparent material such as a clear or smoked Plexiglas. For example, in one advantageous embodiment, members 140 and 142 and baffle member 144 are all formed of a clear Plexiglas. When so formed, door assembly 118 enables a system user to visually observe the electronic modules (e.g., 26 and 28) within cabinet assembly 14a without opening the door assembly 118.

It should be appreciated from the above described configuration of components that the present invention delivers cool air from a cool air source directly to the position relative to heat generating electronic modules that is most efficient for use. Specifically, referring again to FIGS. 3, 5 and 6, when door assembly 118 is closed, cool air from within space 78 is provided through controller 21 and conduit members 89 and 192 into the space 151 defined by plenum door assembly 118. Air within space 151 is forced through aligned openings 160 and 170 in members 142 and 144, respectively and directly to the front faces of electronic modules 26, 28, 30, 32 and 34, respectively. With fans 218 opposite the front faces of the modules, when the fans operate, cool air is pulled through each entire electronic module and over heat generating components therein prior to being expelled into space 216. Air within space 216 then is forced by pressure out opening 210 and into critical environment 10. Although not illustrated, air within environment 10 (see FIG. 1) is then recirculated to the cooling air source where the temperature there is again reduced prior to delivery back into space 78.

Referring again to FIG. 2, many electronic modules (e.g., 26, 28, etc.) are equipped to monitor their own operating temperatures and to that end have a module temperature sensor located at a critical area (e.g., proximate a heat sensitive component) within the module. In FIG. 2 the temperature sensors in modules 26, 28, 30, 32 and 34 are identified by numerals 36, 38, 40,42 and 44, respectively. Each module in cabinet 14a is linked to supervising controller 16 via data bus 35 and can provide messages thereto in one of several standard network protocols (e.g. simple network management protocol (SNMP), etc.). Thus, each module is capable of determining its own internal temperature and communicating that temperature to supervising controller 16 via a standard network protocol.

Figure 11:
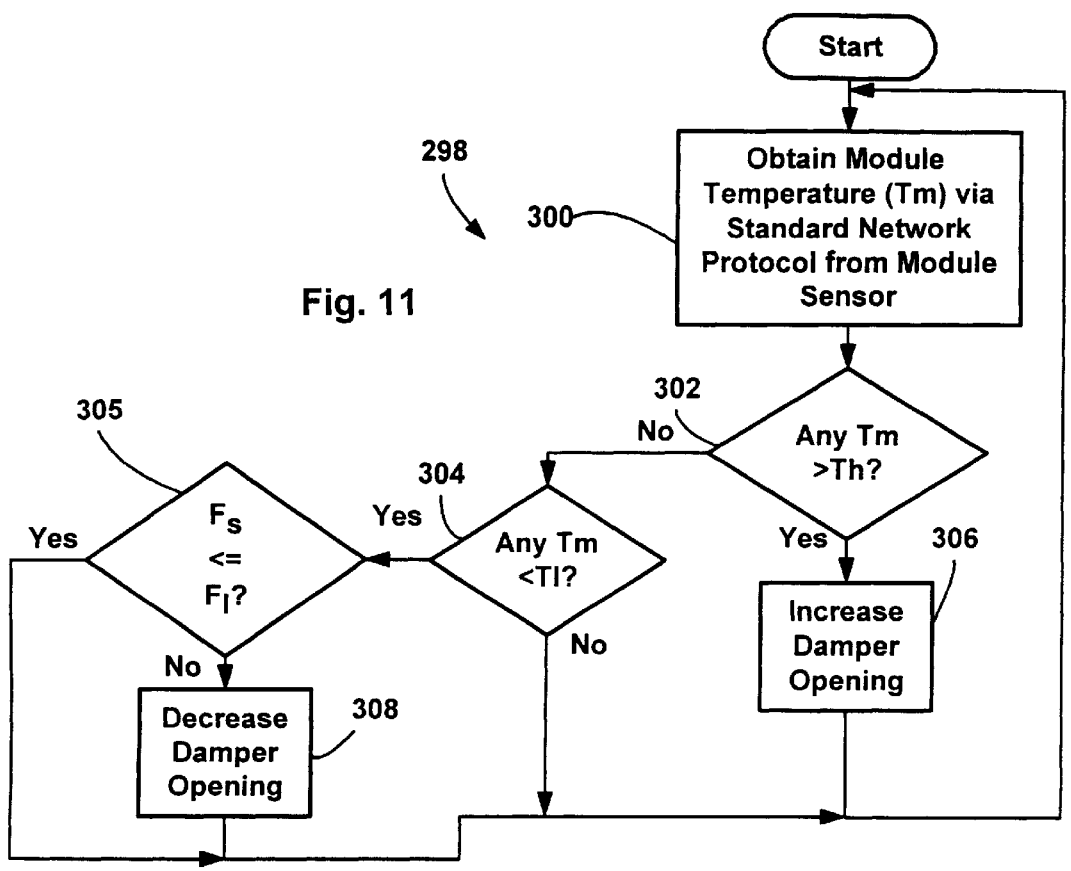
FIG. 11 is a flow chart illustrating a method whereby a server used temperatures from internal module temperature sensors to control a damper.

Upon receiving temperature readings from modules 26, 28, 30, 32 and 34, supervising controller 16 can convert that temperature to a protocol used by the corresponding cooling controller (e.g., 21) and provide the temperature information to the controller. Cooling controller 21 can use the temperature readings to perform one or more control functions. In the alternative supervisory controller 16 may control controller 21 based on the temperature. For instance, controller 16 may compare each of the module temperatures to threshold temperatures to determine if module temperatures are within an optimal range. An exemplary method 298 is illustrated in FIG. 11. Note that while method 298 is described as being performed by controller 16, the method 298 could also be performed via controller 21. At block 300 supervising controller 16 receives temperature readings from each module via a standard network protocol. In addition, controller 16 also receives a flow rate reading from each of the cooling controller flow rate sensors (e.g. 51).

Next at block 302 supervising controller 16 compares each module temperature $T_m$ to a threshold temperature that is at the high end of an acceptable temperature range where any module temperature exceeds the threshold temperature $T_h$, control passes to block 304 where supervising controller 16 determines if any temperature is less than a low threshold temperature $T_l$. If all module temperatures are greater than the low threshold control passes back to block 300 where the module temperatures are again obtained and the process continues.

Referring again to block 304, where any module temperature is below the low threshold control passes to block 305 where controller 16 compares the flow rate $F_s$ from controller sensor 51 to a minimum flow rate $F_l$. Where the flow rate First and second is less than or equal to the minimum flow rate control passes back to block 300. However, where the sensed rate $F_s$ is greater than the minimum flow rate $F_l$, control passes to block 308 where supervising controller 16 decreases the damper opening to reduce cooling air flow to the corresponding cabinet.

Referring again to block 302, where any module temperature is above the high threshold temperature control passes to block 306 where supervising controller 16 decreases the increases the damper opening to increase cooling air flow to the corresponding cabinet.

Thus, module temperature sensors that are already provided in each module 26, 28 etc., can be used to control controller 21 thereby reducing costs associated with previous systems that required dedicated sensors. In addition, existing network linkages can be employed to provide the temperature readings in SNMP or some other standard protocol without additional costs.

Referring again to FIG. 5, as indicated above often power cables and data buses are located within the space 78 below assembly 74 to maintain unobstructed paths within the critical environment 10. Because of such practices the air pressure and temperature in space 78 can vary appreciably despite the fact that equilibrium is ideal. In conventional systems that cool all of the space within a critical environment, such differences in equilibrium, although important, are relatively less important as the air forced into the environment 10 (see FIG. 1) generally mixes prior to being pulled into module cabinets.

In the case of systems like the present system where cool air is delivered directly to cabinet assemblies (e.g., 14a), disparate pressures and temperatures in space 78 are relatively more important. For instance, at one extreme, if no cool air was being delivered to a particular damper, even if the damper were fully open and the module fans were fully on, the cooling effect would be minimal at best. Thus, as indicated above, pressure and temperature sensors 50 and 52 are provided on each damper (e.g., 21) (see FIG. 2). The pressure and temperature readings from sensors 50 and 52 are provided to supervising controller 16. Supervising controller 16 uses these readings to diagnose problems such as obstructions within space 78, inefficient cooling and inefficient pressure generation.

Moreover, referring again to FIG. 2, by also providing an ambient temperature sensor 69 at the inlet to the air cooling system, the temperature reading from damper temperature sensor 52, the temperature reading from the ambient temperature sensor 69 and the flow rate reading from sensor 51 can be monitored and stored for use by supervising controller 16 to compute cooling costs on cabinet by cabinet bases so that cooling costs can be equitably charged to computing customers.

Figure 12:
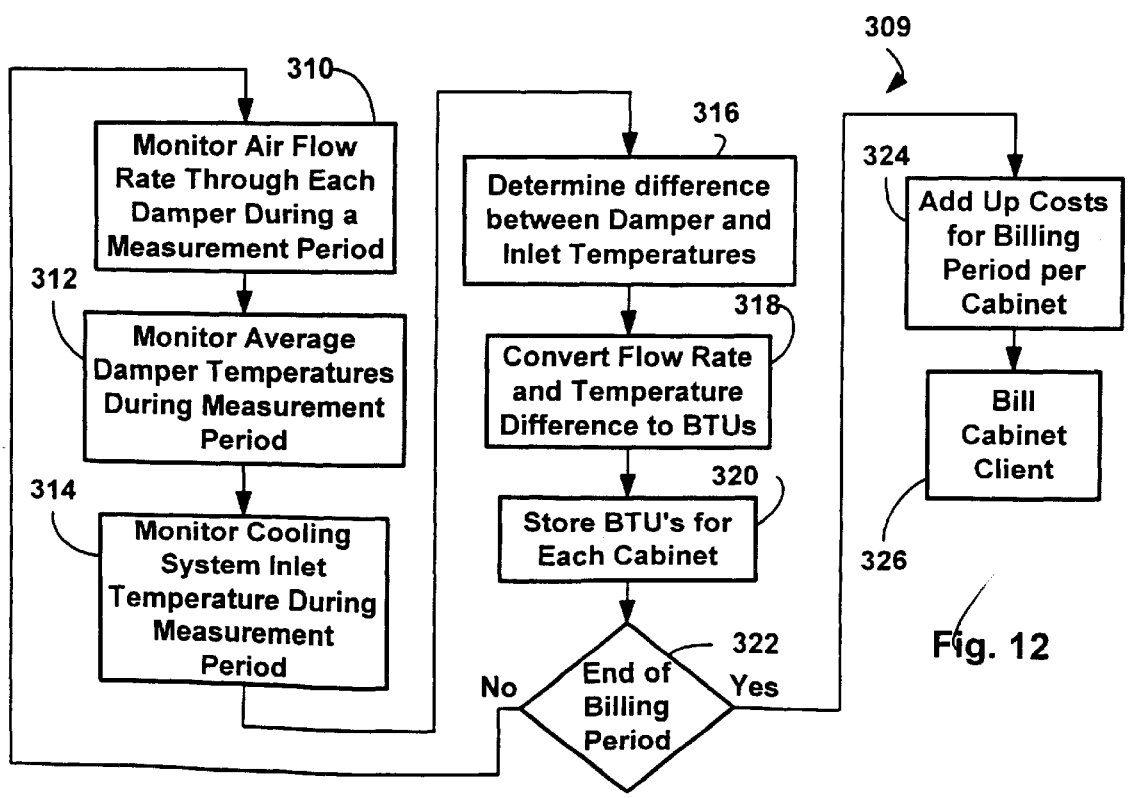
FIG. 12 is a flow chart illustrating a method whereby a critical environment server determines, on a cabinet by cabinet basis, the energy used to cool the modules therein and generates a bill automatically.

To this end, an exemplary method 309 for computing cooling costs is illustrated in FIG. 12. Beginning at process block 310, supervising controller 16 monitors air flow rate through each damper during a measurement period. Next, at block 312 supervising controller 16 monitors average damper temperatures during the measurement period for each of the dampers in FIG. 2. At block 314 supervising controller 16 monitors the cooling system inlet temperature from sensor 69 during the measurement period.

Continuing, at block 316, supervising controller 16 determines the difference between the damper and inlet temperatures. At block 318 supervising controller 16 converts the flow rate and temperature difference to BTUs. At block 320, the supervising controller 16 stores the results of the BTU calculations for each cabinet in the critical environment. At block 322 supervising controller 16 determines whether or not a billing period for cooling costs has ended. If the billing period has not ended, control passes back up to block 310 and the process continues.

Where the billing period has been completed, control passes to block 324 where supervising controller 16 adds up the costs for the billing period on a per-cabinet basis. Finally, at block 326, supervising controller 16 generates a bill corresponding to each of the cabinets and those bills are then provided for clients accordingly.

While certain methods and apparatus are described above, the present invention is not meant to be so limited and other embodiments are contemplated. For example, referring again to FIG. 3, one feature which may be added to the system described above includes a lateral extension 220 that extends from baffle member 144 and which, when door assembly 118 is in the closed position, extends through an opening 222 in lateral housing wall 108. Extension 220 can be used by an environment administrator to adjust the relative positions of openings 170 and 160 in the plenum door assembly to modify the effective openings 178 without having to open door assembly 118.

Figure 9:
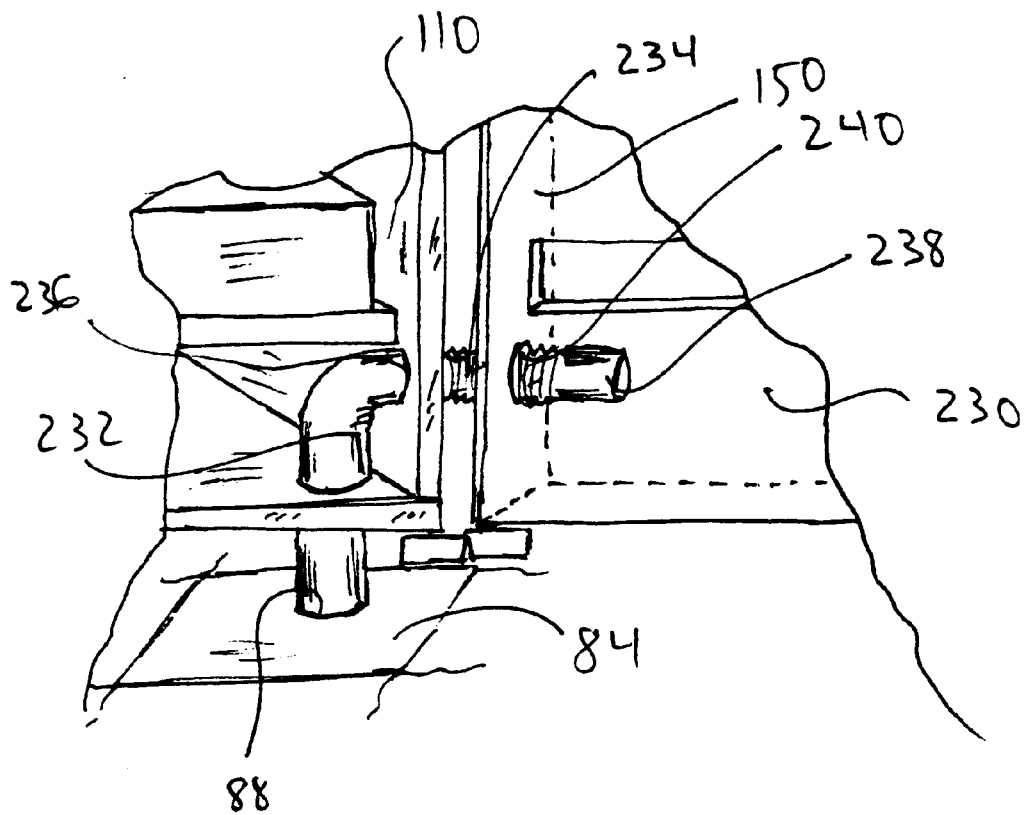
FIG. 9 is a perspective view a second cool air tube passageway assembly.

In addition, referring to FIG. 9, another embodiment of a conduit member for delivering cool air from below a control tile 84 into a plenum space 230 is illustrated. To this end, instead of having two separate conduit members 89 and 192 as in FIG. 4, a single conduit member 232 may be provided where a bendable portion 234 of the tube member is flexible and can accommodate pivotal motion of the door assembly 118. To this end, conduit member 232 extends through an aperture 88 within tile 84. The bottom end of member 232 is similar to the bottom of member 89 described above and therefore will not be described here again. The top end of member 232 bends and forms an essentially 900 angle and extends through an aperture 236 in lateral housing wall 110. After extending through aperture 236, the distal end of member 232 has an accordion section allowing that portion of member 232 to bend without cutting off the passage way therethrough. The most distal end 238 of member 232 extends through an aperture 240 in lateral wall 150 of the plenum door assembly 118. Thus, air is provided through tube 232 to the space 230 within the plenum door assembly 118.

Figure 10:
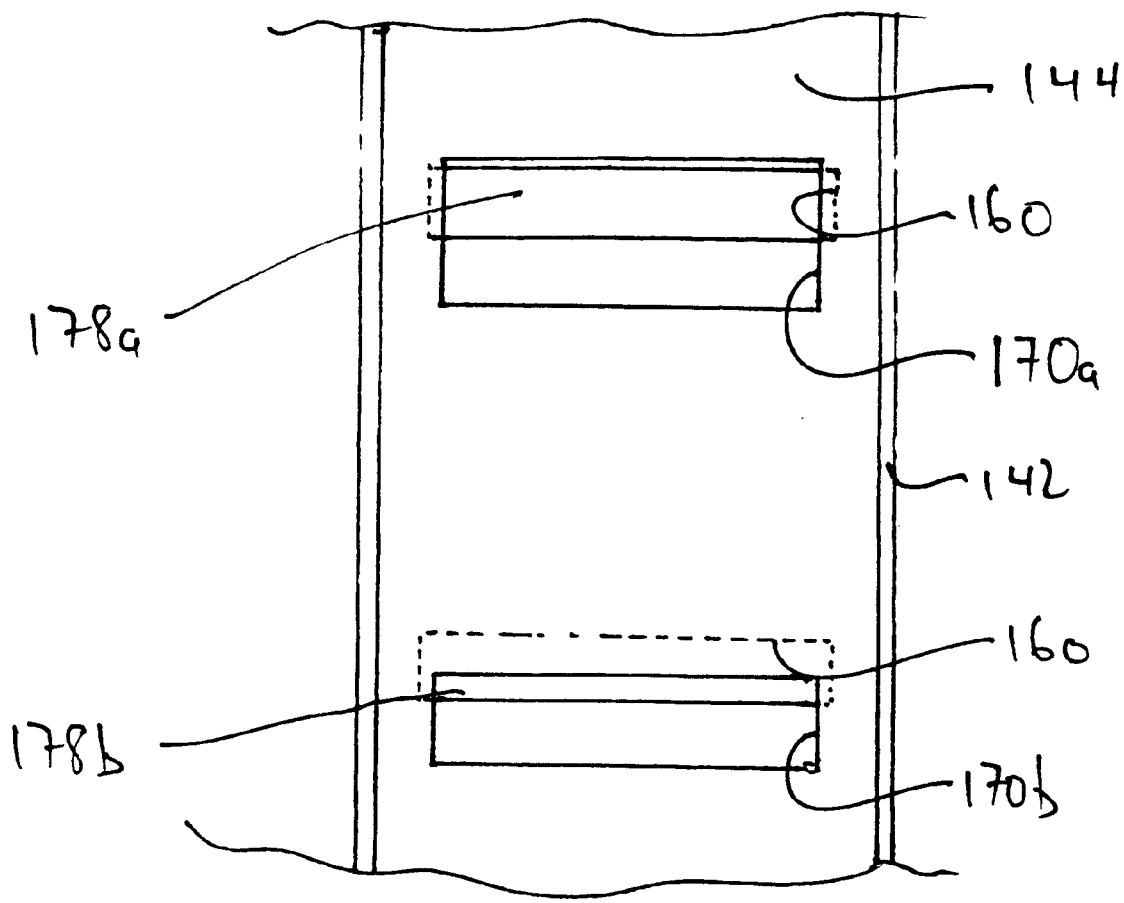
FIG. 10 is a view similar to FIG. 7, albeit illustrating a plenum having a different baffle design.

Moreover, referring to FIGS. 7 and 8, while openings 160 and 170 are essentially identical, other embodiments are contemplated where openings in members 142 and 144 are different, where the opening member 142 are different and where openings in member 144 are different so that the effective openings vertically spaced along the plenum assembly are not equispaced. For example, in some cases it may be advantageous to have larger effective openings at the top of the plenum assembly than at the bottom because the pressure within space 151 (see FIG. 5) will be greater at the bottom than at the top. To this end see FIG. 10 where opening 170*a* is larger than opening 170*b* and therefore effective opening 178*a* is larger than effective opening 178*b*.

Also, regarding plenum openings, other systems are contemplated that may include more than one separately adjustable baffle such that various openings along the plenum can be separately adjusted.

Furthermore, while the invention is described as including a complete plenum door assembly 118, other embodiments are contemplated where a plenum assembly can be retrofitted and attached to an existing cabinet door. To this end, often cabinets already include a space adjacent module front faces to allow air circulation. A retro-fit assembly would be possible within this space and would operate in a fashion similar to that described above. Referring to FIG. 13, in the alternative, a plenum retrofit may be attached to the outside of an existing cabinet door. In FIG. 13, a cabinet 400 defines a space 410 for housing modules and includes a door 406. A plenum 408 is attached to the outside surface of door 406 and defines a plenum space or volume 402 therewith. An opening 404 is linked to a cool air source to direct air into space 402 which then passes through openings (not illustrated) in door 406 along the directions of the arrows illustrated.

In yet another aspect a plenum door assembly may include channel restricting members that cooperate to direct air flow within a plenum space to different openings that open into a cabinet. To this end, referring to FIGS. 14 and 15, a transparent door assembly 420 includes a door member 451 that forms a plurality of openings collectively referred to by numeral 424. Openings 424 are arranged to form upper, middle and lower rows 438, 436 and 434 of openings, respectively. Lateral plenum walls 422 and 423, top plenum wall 425 and bottom wall 453 separate door member 451 from an opposing plenum wall 481 to form a plenum space 421. Bottom wall 453 forms an opening 426 that, when assembly 420 is mounted to a cabinet, mates with a cooling source to provide cool air to space 421 and through openings 424 to the cabinet.

Referring specifically to FIG. 14, the top row 438 of openings has twice as many openings as bottom row 434 and middle row 436 has one and one-half as many openings as bottom row 434. Additional channel restricting walls 430, 441, 443 and 428 are formed between door member 451 and plenum member 481. Walls 430 and 441 together form a first tier shaped structure positioned so that a narrow end of the structure is proximate the top of assembly 420 (i.e., is relatively proximate top plenum wall 425) and the wide end of the structure is proximate the bottom end of assembly 420. Similarly, walls 443 and 428 together form a second restricting tier shaped structure that is narrower proximate the top of assembly 420 than at the bottom. One other channel restricting wall 477 between walls 451 and 481 extends from a first side of opening 426 to lateral plenum wall 422. Similarly, another restricting wall 479 between walls 451 and 481 extends from a second side of opening 426 to lateral plenum wall 423. Together walls 477, 479, 430, 441, 443 and 428 form channels 427, 431 and 429 within the plenum space 421 that are narrower at the bottom of plenum space 421 than at the top (i.e., are narrower proximate opening 426).

As illustrated, wall member 422, restricting wall 477 and member 430 together define channel 427 along the left side of assembly 420 where two bottom row 434 openings 424 are encountered followed by three and four openings 424 in rows 436 and 438, respectively. The width of channel 427 increases from bottom to top. Similarly, members 430 and 428 form center channel 431 that increases in width from bottom to top and includes two, three and four openings 424 from rows 434, 436 and 438, respectively. Moreover, wall 423, wall 474 and wall 428 from third channel 429 that widens from bottom to top and includes two, three and four openings 424 from rows 434, 436 and 438, respectively. By selecting the opening sizes and configuring the channels 427, 431 and 429 appropriately, assembly 420 can be configured such that essentially the same amount of air exits the openings in each of rows 434, 436 and 438. Although not illustrated, separate baffle members (see 144 in FIG. 3) may be provided, one baffle member for each grouping of openings 424 so that relative opening sizes can be adjusted. For instance, a separate baffle may be provided for the three openings 424 in row 436 and channel 427 while another baffle may be provided for the three openings 424 in row 436 and channel 431.

Thus, referring still to FIG. 14, if the plenum is viewed as having top and bottom sections that correspond to the top and bottom of assembly 420 where opening 426 opens into the bottom section, in some advantageous embodiments, the channels 427, 429, 431 widen as air moves from the bottom section to the top section and, generally speaking, the combined space or areas of the openings 424 in the bottom section is less than the combined areas of the openings 424 in the top section.

Referring now to FIGS. 16 and 17, another door assembly 500 that has similar operating characteristics as assembly 420 of FIG. 14 is illustrated. Assembly 500 includes a door wall 512 and a plenum wall 520 that are separated by top, bottom and two lateral walls 502, 504, 506 and 508, respectively, to form a plenum space 550 therebetween. Bottom wall 508 forms an opening 516 that, when assembly 500 is mounted to a cabinet and is in a closed position, mates with a cooling air source to provide cooling air to space 550.

Door wall 512 forms a plurality of openings 524 that open from space 550 into a cabinet (not illustrated) when assembly 500 is mounted and closed to the cabinet. Openings 524 are arranged into upper, middle and lower rows 526, 528 and 530, respectively.

In order to deliver cooling air generally evenly to a cabinet, assembly 500 has two features. First, as in the case of assembly 420 in FIG. 14, door wall 512 forms more openings in upper row 526 than in the lower and middle rows and middle row 528 forms more openings than in lower row 530. Second, referring specifically to FIG. 17, plenum wall 520 bows away from door wall 512 being relatively closer to wall 512 at a bottom end (i.e., proximate opening 516) than at the top end.

Furthermore, referring again to FIG. 2, temperature sensor 73 inside cabinet 14*a* is linked to controller 21. Sensor 73 may provide redundancy for sensors 36, 38, etc., or may supplant the module sensors 36, 38, etc., so that controller 21 operates independent of controller 16.

Sensor 75 on the outside of cabinet 14*a* is also linked to controller 16 and provides an ambient temperature reading thereto at the cabinet location. The temperature at the cabinet location may have a dual function. First, the temperature may be used as an ambient temperature indicator or all of the temperature readings from all of the temperature sensors may be averaged to generate an ambient temperature. Second, the temperature readings from all of the external sensors (e.g., 75) may be used to generate a three dimensional temperature graph for observation by an environment administrator.

Moreover, referring again to FIGS. 2 and 3, in at least one embodiment of the inventive cabinet, a cabinet closure sensor or latch 31 is provided. The illustrated latch is a proximity sensor that senses when door assembly 118 is in the closes position. Latch 31 is linked to controller 16 and indicates assembly 118 status (i.e., opened or closed). When assembly 118 is closed controller 16 (or controller 21 where controller 21 controls the damper) causes the damper associated with the cabinet to direct cooling air into the plenum and cabinet. However, where assembly 118 is opened, controller 16 causes the corresponding damper to close or at least reduce the flow therethrough to minimize loss of cool air into the ambient. Furthermore, controller 16 may track the duration of any period when the door assembly 118 is open and, when the period reaches some threshold value (e.g., 15 minutes), may generate an alarm indicating that the door has been opened.

In addition, while certain control algorithms have been described above, it should be appreciated that other variations also exist. For example, controller 21 may control its corresponding damper simply as a function of one or more temperatures in cabinet 14a. In the alternative, controller 21 may receive one or more temperature readings from within cabinet, determine a desired flow rate as a function of the temperatures and then modify damper position to achieve the desired flow rate. As yet another alternative controller 16 may determine a desired flow rate for a cabinet and, based on a static pressure at an entry port to a corresponding damper, adjust damper position to provide the desired flow rate.

To apprise the public of the scope of this invention, the following claims are made:

What is claimed is:

1. An apparatus for use with a frame defining a front, a back and first and second sides extending from the frame front to the frame back for supporting and mounting at least one electronic module, the module including a front wall and a back wall, the front wall forming at least one inlet and the back wall forming at least one outlet, the apparatus for delivering air to the at least one module and comprising:

at least one plenum mounted to the first side and defining a passageway adjacent the front side of the frame, the plenum forming at least one opening facing the first side, wherein the plenum includes a door member and at least one wall member spaced from the door member so as to form the passageway, the door member having an edge and being hingedly linked to the frame along the edge for rotation about the edge between a closed position where the plenum is adjacent the first side and the opening is proximate the first side and an open position where the plenum is extended from the first side;

a cooling air source linked to the plenum to provide cooling air to the plenum; and a first mating member linked to the air source and a second mating member linked to the plenum and positioned proximate the first mating member when the door member is closed, the first and second mating members configured such that one of the mating members receives the other mating member when the door member is closed and the mating members together form a passage from the air source to the plenum.

2. The apparatus of claim 1 wherein the air source is positioned below the door member and the second mating member extends upward below the door member when the door member is in the closed position.

3. The apparatus of claim 2 wherein the second mating member extends upward below the hinge.

4. The apparatus of claim 3 wherein the air source is below a floor that supports the frame.

5. An apparatus for use with a frame defining a front, a back and first and second sides extending from the frame front to the frame back for supporting and mounting at least one electronic module, the module including a front wall and a back wall, the front wall forming at least one inlet and the back wall forming at least one outlet, the apparatus for delivering air to the at least one module and comprising:

at least one plenum mounted to the first side and defining a passageway adjacent the front side of the frame, the plenum forming at least one opening facing the first side, wherein the plenum includes a door member and at least one wall member spaced from the door member so as to form the passageway, the door member having an edge and being hingedly linked to the frame along the edge for rotation about the edge between a closed position where the plenum is adjacent the first side and the opening is proximate the first side and an open position where the plenum is extended from the first side, and wherein the plenum further includes first and second plenum lateral walls and an end wall, the lateral walls opposing each other and traversing the distance between the door member and the wall member and the end wall traversing the distance between the lateral wall members opposite the air source;

a cooling air source linked to the plenum to provide cooling air to the plenum; and a conduit member positioned proximate the hinged edge of the door connecting the air source to the plenum.

6. An apparatus for use with a frame defining a front, a back and first and second sides extending from the frame front to the frame back for supporting and mounting at least one electronic module, the module including a front wall and a back wall, the front wall forming at least one inlet and the back wall forming at least one outlet, the apparatus for delivering air to the at least one module and comprising:

at least one plenum mounted to the first side and defining a passageway adjacent the front side of the frame, the plenum forming at least one opening facing the first side, wherein the plenum further includes a baffle member mounted adjacent the opening for movement with respect thereto, the baffle member movable with respect to the opening such that the baffle member blocks different portions of the opening; and a cooling air source linked to the plenum to provide cooling air to the plenum.

7. The apparatus of claim 6 wherein the plenum forms a plurality of openings and wherein the baffle member is moveable with respect to the plurality of openings to block varying portions of the openings.

8. The apparatus of claim 6 wherein the plenum forms a plurality of openings and the apparatus further includes a plurality of baffle members, the baffle members moveable with respect to the openings to block varying portions of the openings.

9. The apparatus of claim 6 wherein the plenum and the baffle member are at least in part formed of transparent material.

10. An apparatus for use with a frame defining a front, a back and first and second sides extending from the frame front to the frame back for supporting and mounting at least one electronic module, the module including a front wall and a back wall, the front wall forming at least one inlet and the back wall forming at least one outlet, the apparatus for delivering air to the at least one module and comprising:

at least one plenum mounted to the first side and defining a passageway adjacent the front side of the frame, the plenum forming at least one opening facing the first side; and a cooling air source linked to the plenum to provide cooling air to the plenum, wherein the plenum includes two sections and the source opens into a first of the sections, the plenum forming at least one channel that increase in width from the first to the second sections.

11. The apparatus of claim 10 wherein the opening includes a plurality of openings and wherein the openings in the first section have a greater combined space than the openings in the second section.

12. An apparatus for use with a frame defining a front, a back and first and second sides extending from the frame front to the frame back for supporting and mounting at least one electronic module, the module including a front wall and a back wall, the front wall forming at least one inlet and the back wall forming at least one outlet, the apparatus for delivering air to the at least one module and comprising:

at least one plenum mounted to the first side and defining a passageway adjacent the front side of the frame, the plenum forming at least one opening facing the first side, wherein the plenum includes a door member and at least one wall member spaced from the door member so as to form the passageway, the door member having an edge and being hingedly linked to the frame along the edge for rotation about the edge between a closed position where the plenum is adjacent the first side and the opening is proximate the first side and an open position where the plenum is extended from the first side;

a cooling air source linked to the plenum to provide cooling air to the plenum; and a damper positioned between the cooling source and the plenum, a sensor for sensing the position of the door member and a processor, the sensor and damper linked to the processor, when the door member is in the open position, the processor causing the damper to reduce air flow to the plenum.

13. The apparatus of claim 12 wherein, when the door member is opened, the processor causes the damper to block air flow to the plenum.

14. A cooling assembly for cooling at least one electronic module, the module including a front wall and a back wall, the front wall forming at least one inlet and the back wall forming at least one outlet, the front wall also forming a front surface, the assembly comprising:

a frame defining a front side, a back side and first and second sides that separate frame front and back sides;

a rack mounted inside the frame including an upright member and at least one essentially horizontal shelf member, the module positionable on the shelf member such that the front surface faces the front side;

at least one air delivery member forming at least one opening, the delivery member mounted to the frame such that the opening faces the front surface, wherein, when in a closed position, the delivery member essentially blocks the front side of the frame, wherein the delivery member is hingedly mounted to the frame for movement between the closed position and an open position where the first side is unobstructed, and wherein size of the opening formed by the delivery member is adjustable; and a cooling air source linked to the delivery member to deliver cooling air to the delivery member.

15. A cooling assembly for cooling at least one electronic module, the module including a front wall and a back wall, the front wall forming at least one inlet and the back wall forming at least one outlet, the front wall also forming a front surface, the assembly comprising:

a frame defining a front side, a back side and first and second sides that separate frame front and back sides;

a rack mounted inside the frame including an upright member and at least one essentially horizontal shelf member, the module positionable on the shelf member such that the front surface faces the front side;

at least one air delivery member forming at least one opening, the delivery member mounted to the frame such that the opening faces the front surface, wherein, when in a closed position, the delivery member essentially blocks the front side of the frame, wherein the delivery member is hingedly mounted to the frame for movement between the closed position and an open position where the first side is unobstructed, and wherein the delivery member forms a plurality of openings facing the rack, at least some of the openings vertically spaced along the delivery member; and a cooling air source linked to the delivery member to deliver cooling air to the delivery member.

16. A cooling assembly comprising:

an electronic module including a front wall and a back wall, the front wall forming at least one inlet and the back wall forming at least one outlet, the front wall also forming a front surface, the module including at least one operating parameter sensor, linked to a data bus and capable of communicating status of the at least one operating parameter via a standard network protocol;

at least one air delivery member forming at least one opening, the delivery member mounted adjacent the module such that the opening faces the front surface;

a damper linked to the air delivery member and linked to the data bus;

a cooling air source linked to the damper; and a processor linked to the bus for receiving the status communication and for controlling the damper as a function of the status communication.

17. The assembly of claim 16 wherein the standard network protocol is the simple network management protocol (SNMP).

18. An apparatus for cooling at least one electronic module inside a module cabinet, the cabinet including a door, the apparatus comprising:

a cooling air source linked to the cabinet;

a sensor for sensing the status of the door; and a controller for controlling the amount of air provided to the cabinet via the cooling air source, the controller linked to the sensor and programmed to modify the cooling air volume delivered to the cabinet as a function of the door status.

19. The apparatus of claim 16 wherein the controller reduces the air delivered to the cabinet when the door is opened.

20. The apparatus of claim 17 wherein the controller blocks air delivery to the cabinet when the door is opened.

* * * * *

UNITED STATES PATENT AND TRADEMARK OFFICE
CERTIFICATE OF CORRECTION

PATENT NO.    : 6,535,382 B2
DATED         : March 18, 2003
INVENTOR(S)   : Bishop et al.

It is certified that error appears in the above-identified patent and that said Letters Patent is hereby corrected as shown below:

Column 20,
Line 61, replace -- 16 -- with "18".
Line 64, replace -- 17 -- with "19".

Signed and Sealed this

Twelfth Day of August, 2003

JAMES E. ROGAN
*Director of the United States Patent and Trademark Office*